United States Patent
Lee et al.

(10) Patent No.: US 10,090,397 B2
(45) Date of Patent: Oct. 2, 2018

(54) SEMICONDUCTOR DEVICE STRUCTURE AND METHOD FOR FORMING THE SAME

(71) Applicant: TAIWAN SEMICONDUCTOR MANUFACTURING CO., LTD, Hsin-Chu (TW)

(72) Inventors: Ming-Chang Lee, Hsinchu (TW); Chia-Der Chang, Hsinchu (TW); Chih-Hung Lu, Zhudong Township (TW); Chung-Tsun Sun, Hsinchu (TW); Chung-Wei Hung, Tainan (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 14/473,585

(22) Filed: Aug. 29, 2014

(65) Prior Publication Data

US 2016/0064516 A1 Mar. 3, 2016

(51) Int. Cl.
| | |
|---|---|
| *H01L 25/065* | (2006.01) |
| *H01L 23/31* | (2006.01) |
| *H01L 23/48* | (2006.01) |
| *H01L 23/50* | (2006.01) |
| *H01L 23/528* | (2006.01) |
| *H01L 29/66* | (2006.01) |
| *H01L 29/78* | (2006.01) |
| *H01L 21/265* | (2006.01) |
| *H01L 29/51* | (2006.01) |
| *H01L 29/165* | (2006.01) |
| *H01L 21/768* | (2006.01) |
| *H01L 21/285* | (2006.01) |

(52) U.S. Cl.
CPC .... *H01L 29/66545* (2013.01); *H01L 29/6656* (2013.01); *H01L 29/66636* (2013.01); *H01L 29/7848* (2013.01); *H01L 21/26506* (2013.01); *H01L 21/28518* (2013.01); *H01L 21/76814* (2013.01); *H01L 21/76831* (2013.01); *H01L 21/76855* (2013.01); *H01L 21/76897* (2013.01); *H01L 29/165* (2013.01); *H01L 29/517* (2013.01); *H01L 29/665* (2013.01)

(58) Field of Classification Search
CPC ................................................ H01L 21/823468
USPC ......................................... 257/900, E21.626
See application file for complete search history.

(56) References Cited

U.S. PATENT DOCUMENTS 7,482,236 B2 * 1/2009 Lee ..................... H01L 29/7923
    257/E21.626
8,361,848 B2 1/2013 Lee et al.
(Continued)

*Primary Examiner* — Julio J Maldonado
*Assistant Examiner* — Hajar Kolahdouzan
(74) *Attorney, Agent, or Firm* — Birch, Stewart, Kolasch & Birch, LLP

(57) ABSTRACT

A semiconductor device structure is provided. The semiconductor device structure includes a semiconductor substrate and a gate stack positioned over the semiconductor substrate. The semiconductor device structure includes spacers positioned over sidewalls of the gate stack. The semiconductor device structure includes a first protective layer positioned between the gate stack and the spacers and between the spacers and the semiconductor substrate. The semiconductor device structure includes a second protective layer positioned between the spacers and the first protective layer. The first protective layer and the second protective layer include different materials.

20 Claims, 10 Drawing Sheets

(56) References Cited

U.S. PATENT DOCUMENTS

| | | | |
|---|---|---|---|
| 2003/0011017 A1* | 1/2003 | Lee | H01L 27/105 257/314 |
| 2012/0139062 A1* | 6/2012 | Yuan | H01L 21/76897 257/411 |
| 2012/0187459 A1 | 7/2012 | Pan et al. | |
| 2015/0187660 A1* | 7/2015 | Patzer | H01L 21/823864 438/217 |

* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
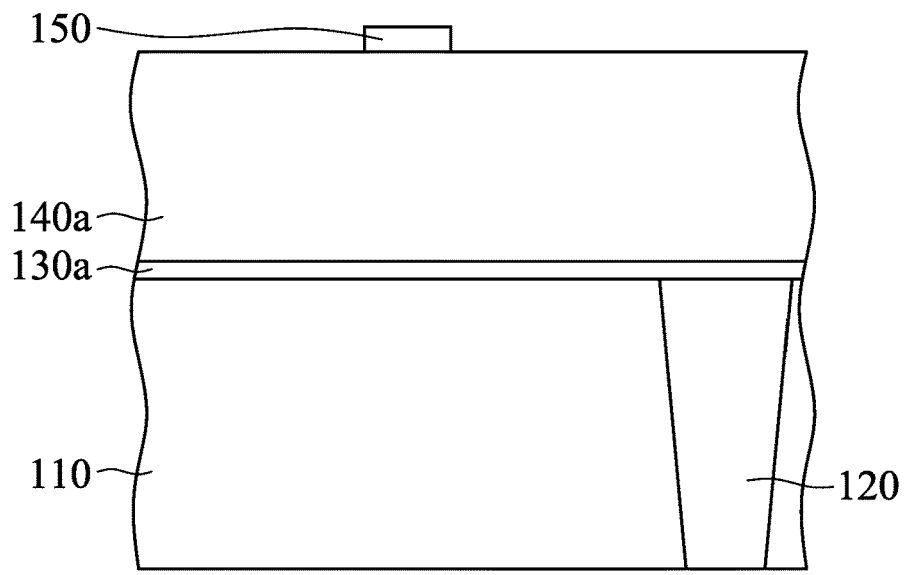
FIGS. 1A-1R are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
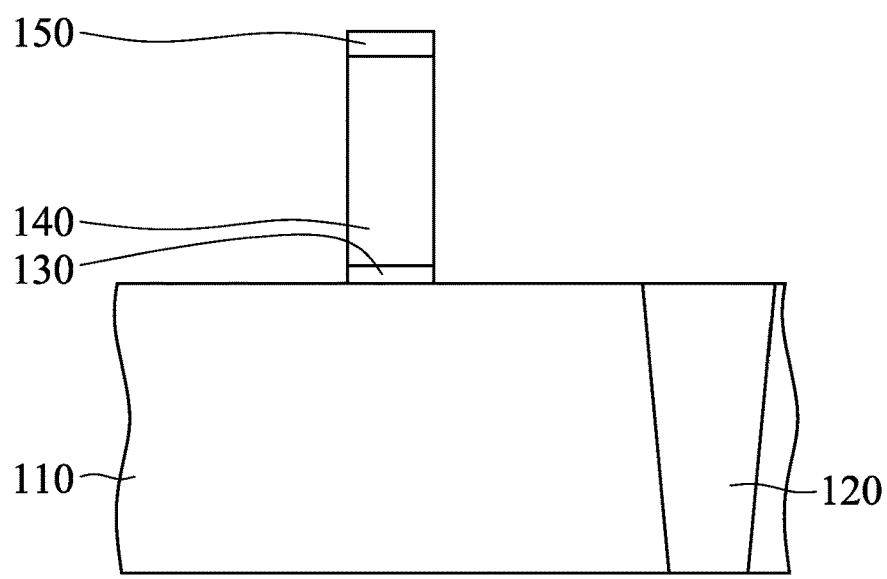
Figure 1C:
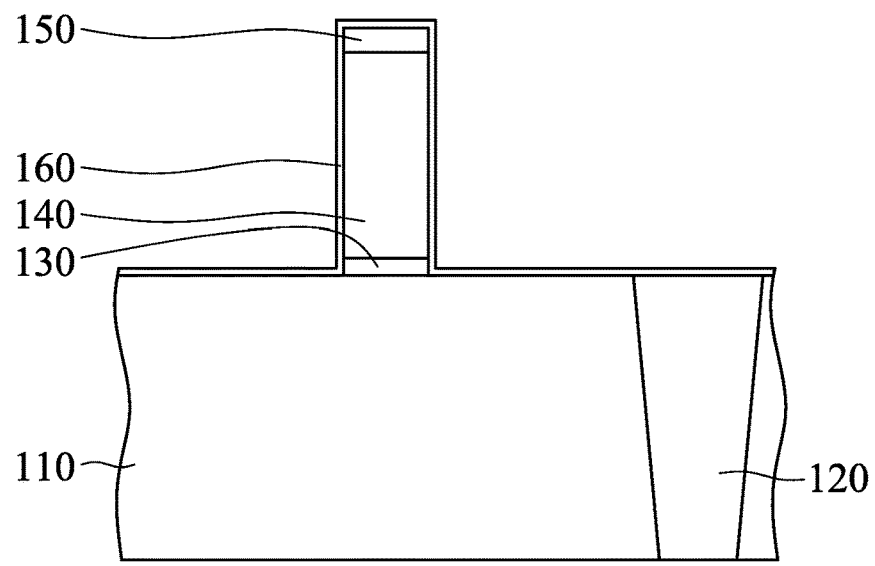
Figure 1D:
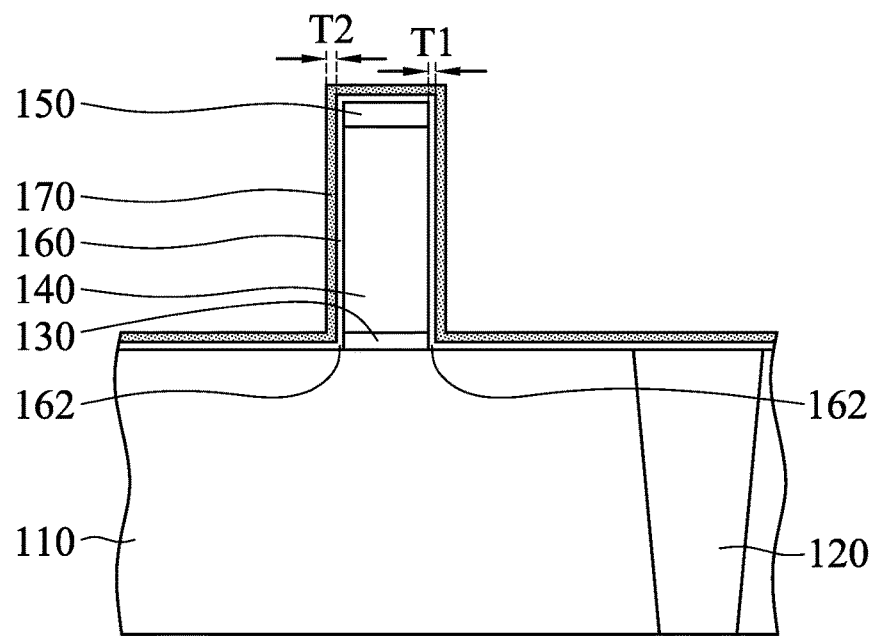
Figure 1E:
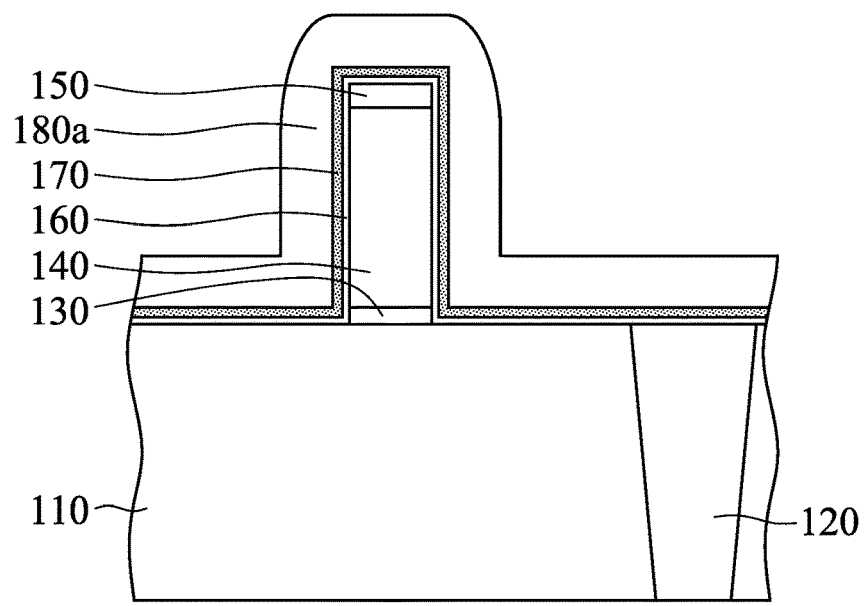
Figure 1F:
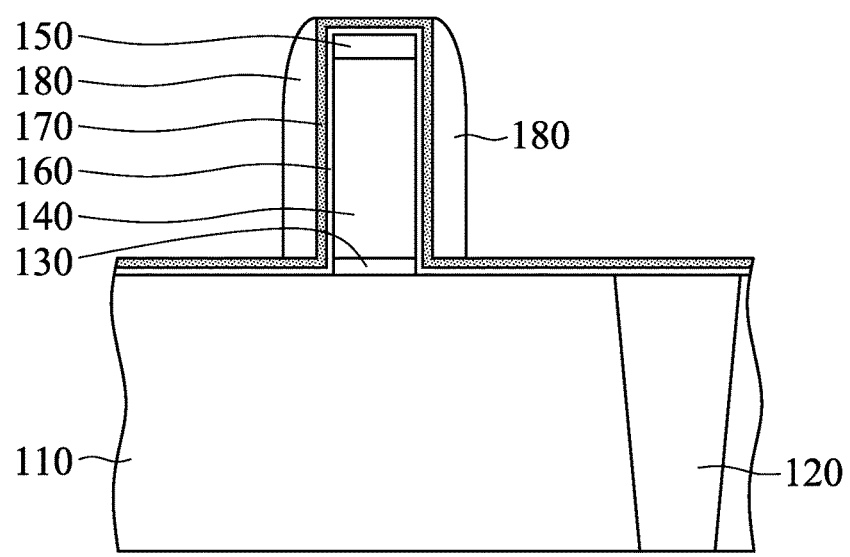
Figure 1G:
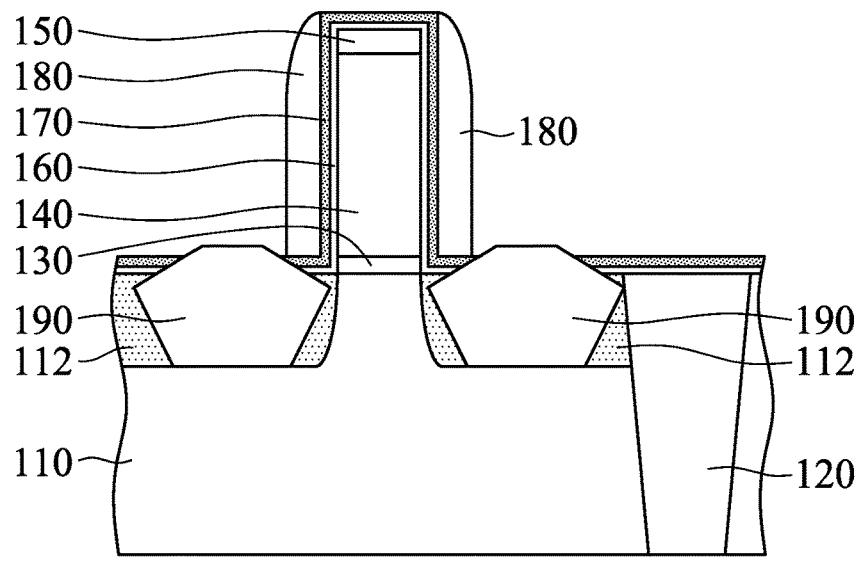
Figure 1H:
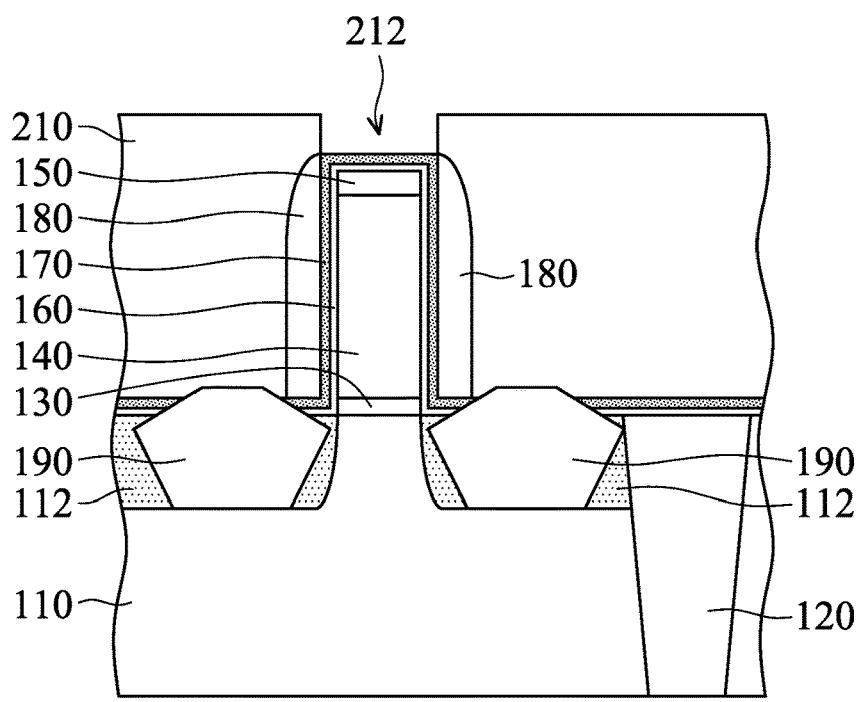
Figure 1I:
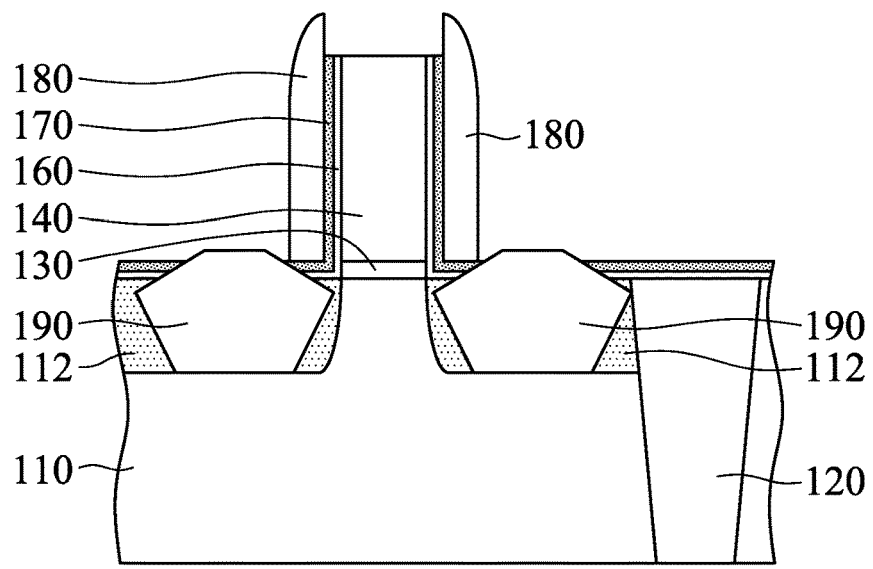
Figure 1J:
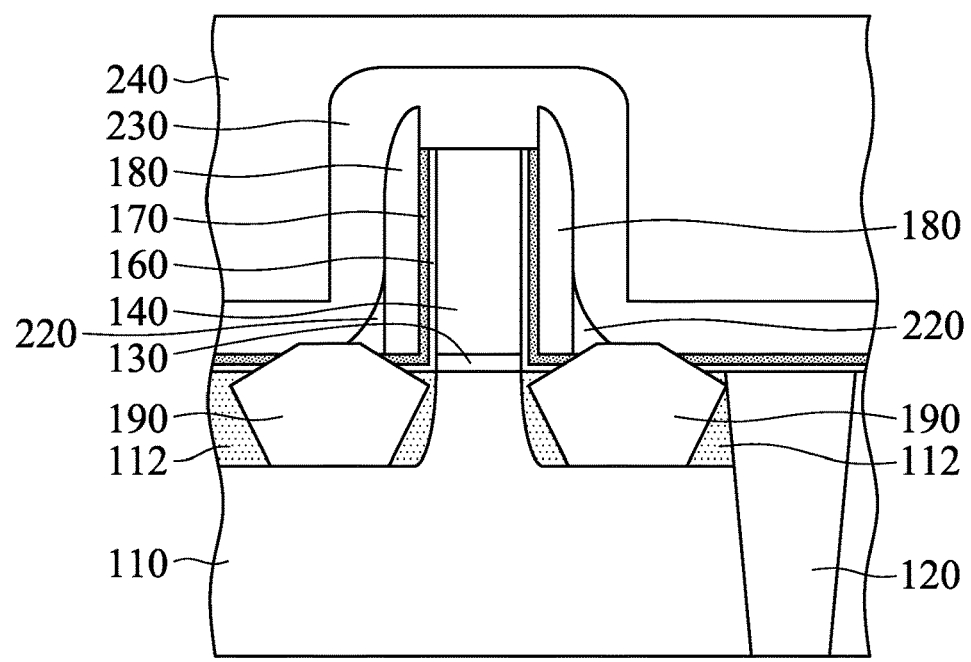
Figure 1K:
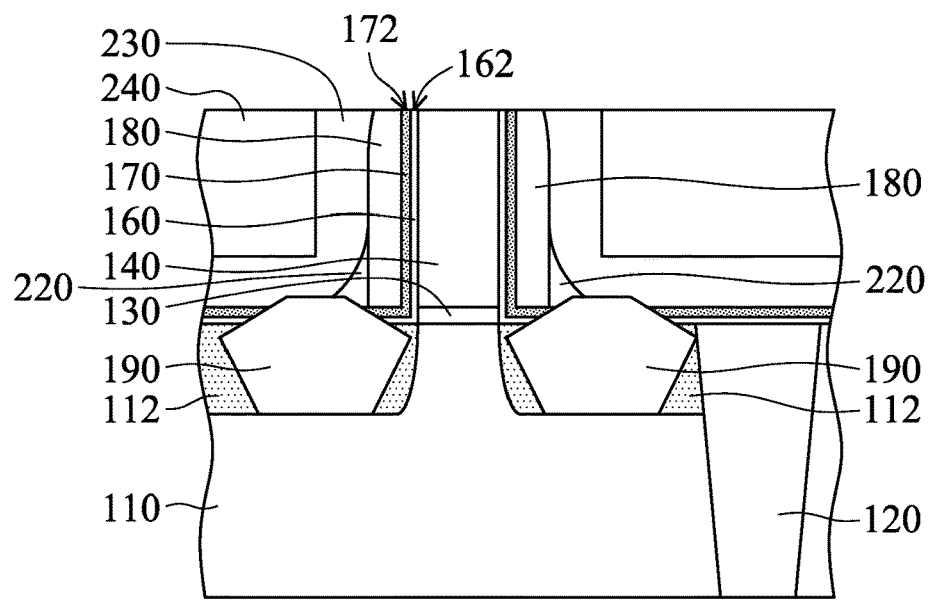
Figure 1L:
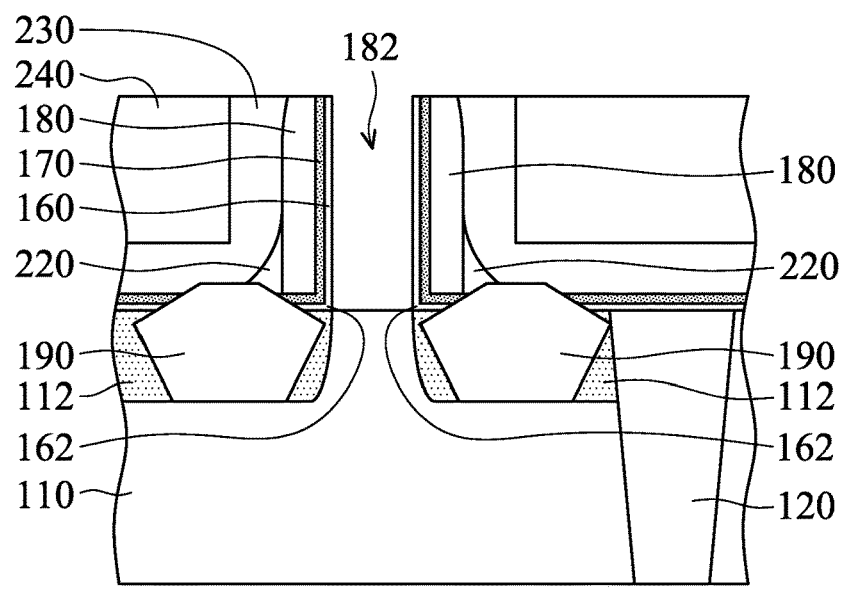
Figure 1M:
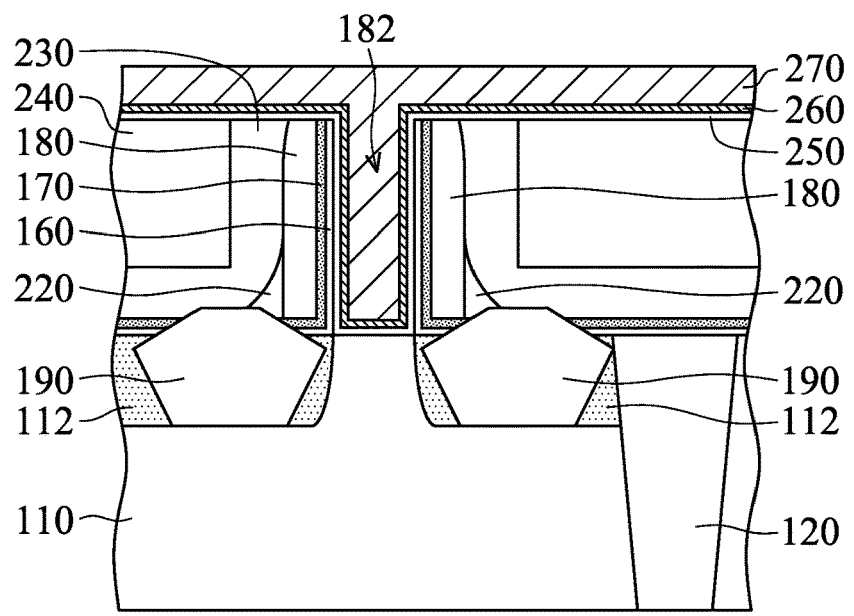
Figure 1N:
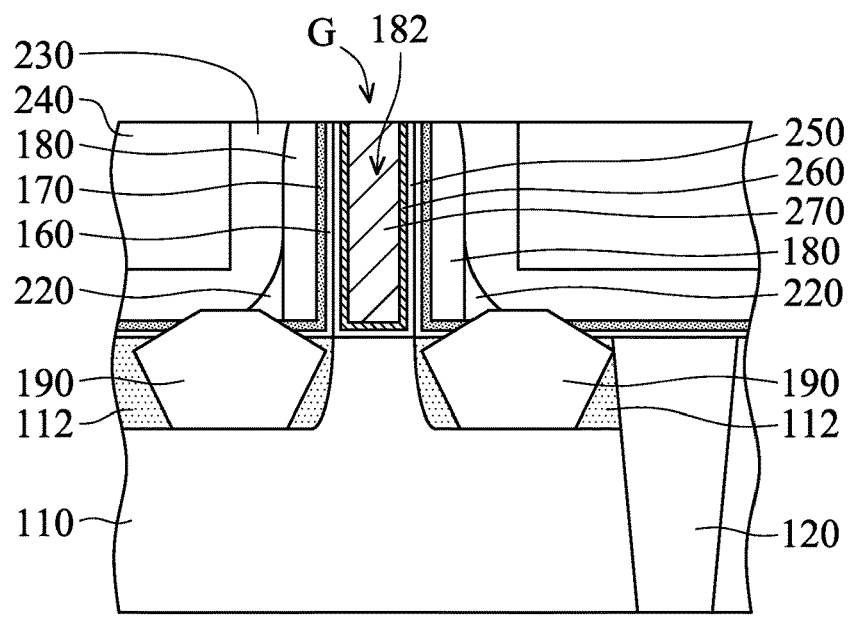
Figure 1O:
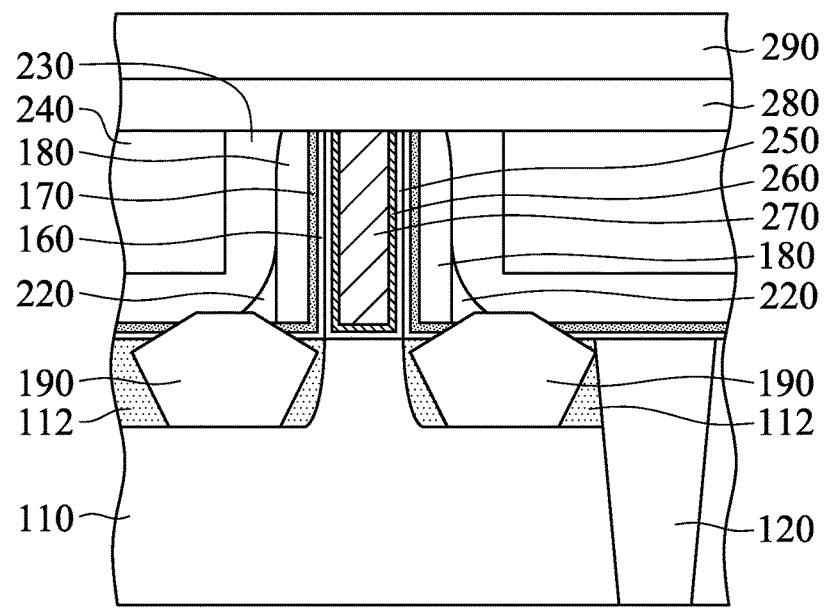
Figure 1P:
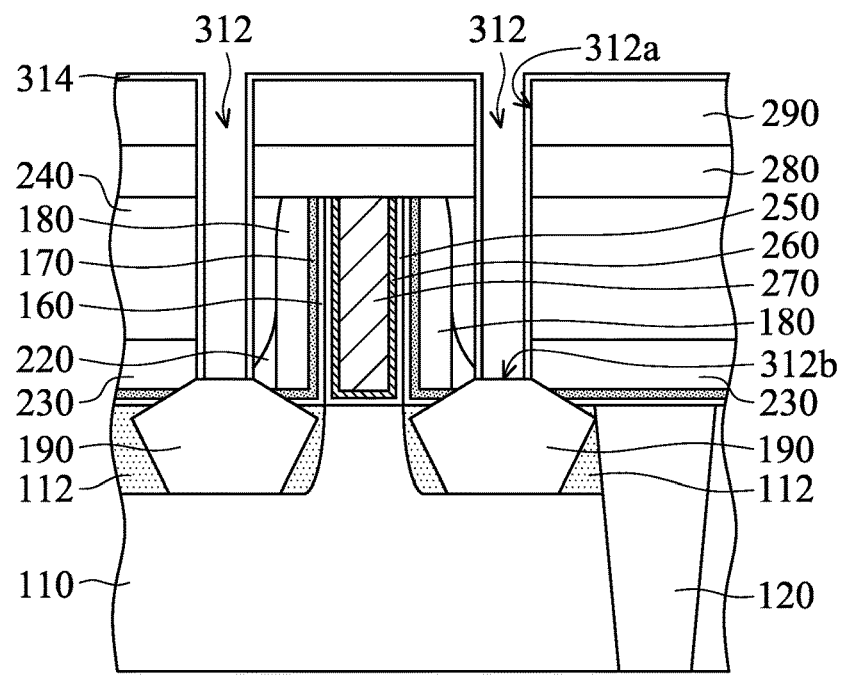
Figure 1Q:
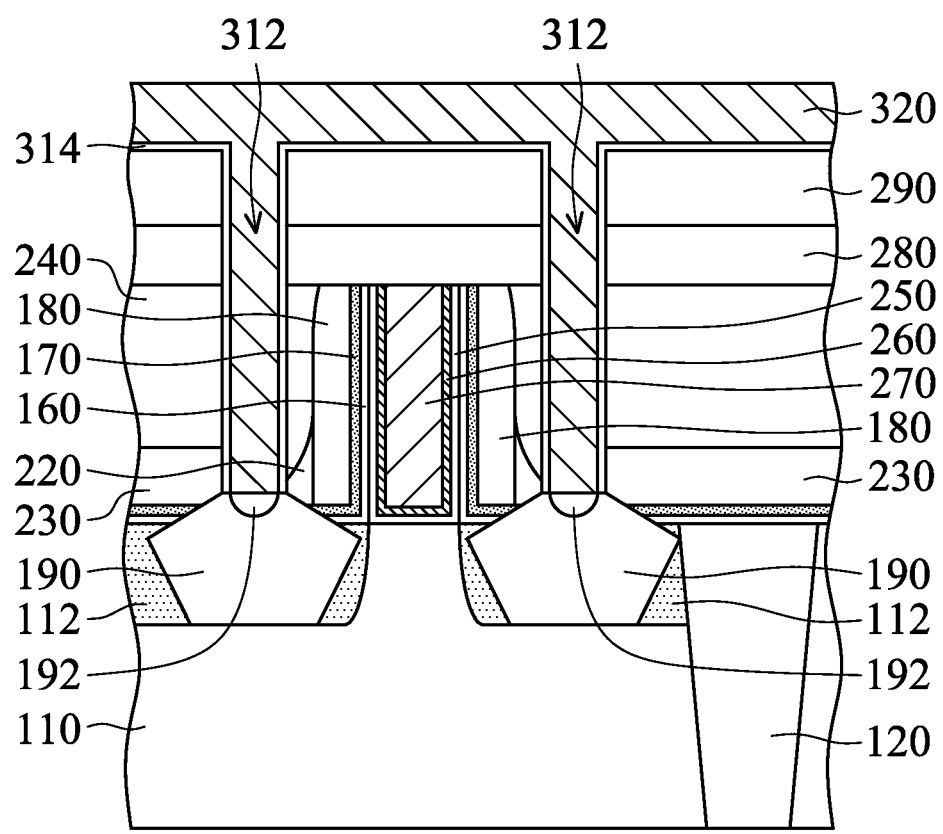
Figure 1R:
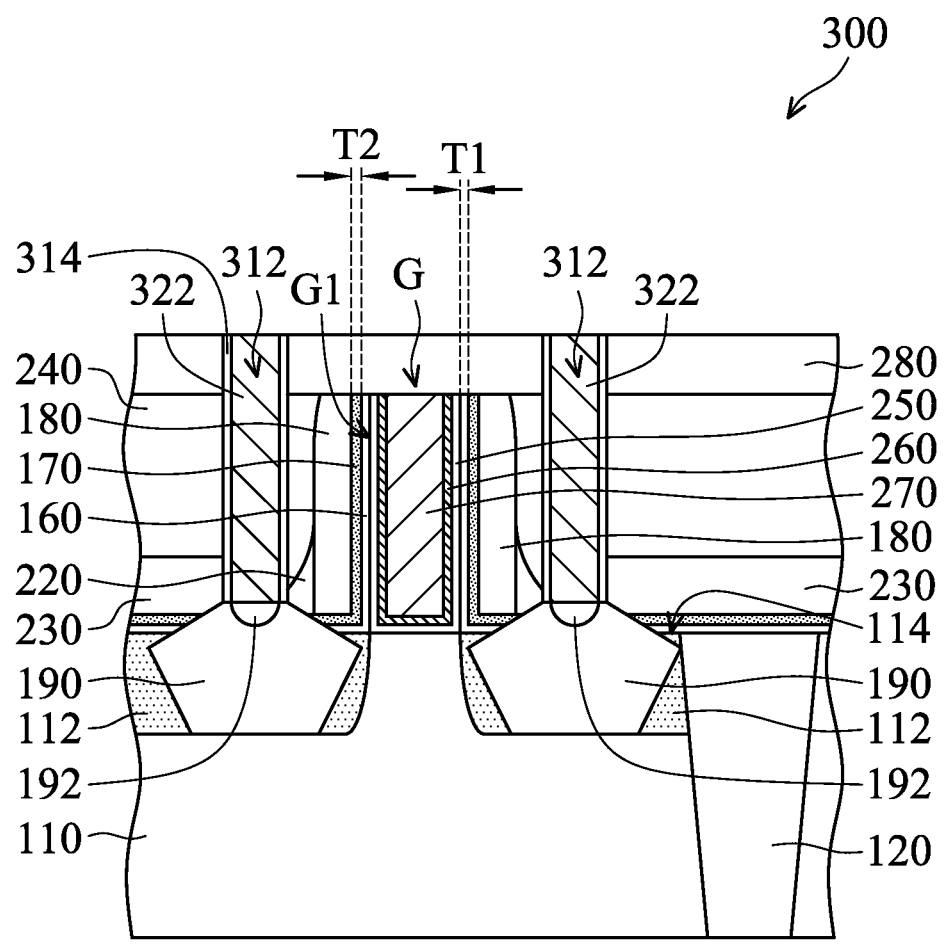

FIGS. 1A-1R are cross-sectional views of various stages of a process for forming a semiconductor device structure 300, in accordance with some embodiments. As shown in FIG. 1A, a semiconductor substrate 110 is provided. The semiconductor substrate 110 includes a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

As shown in FIG. 1A, an isolation structure 120 is formed in the semiconductor substrate 110, in accordance with some embodiments. The isolation structure 120 is configured to define and electrically isolate various device elements (not shown) formed in the semiconductor substrate 110, in accordance with some embodiments.

Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

The isolation structure 120 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the semiconductor substrate 110 by performing a photolithography process and an etching process to the semiconductor substrate 110 so as to form a trench in the semiconductor substrate 110; and filling the trench with the dielectric material.

The etching process for forming the trench includes a dry etching process, a wet etching process, a plasma etching process, or a combination thereof, in accordance with some embodiments. The filling of the trench includes a chemical vapor deposition process, in accordance with some embodiments. In some embodiments, the filled trench has a multi-layer structure, such as a thermal oxide liner layer filled with silicon nitride or silicon oxide.

As shown in FIG. 1A, a gate dielectric material layer 130a is deposited over the semiconductor substrate 110, in accordance with some embodiments. The gate dielectric material layer 130a is made of silicon oxide, in accordance with some embodiments. The gate dielectric material layer 130a is deposited using a chemical vapor deposition process (CVD process), in accordance with some embodiments.

As shown in FIG. 1A, a dummy gate material layer 140a is deposited over the gate dielectric material layer 130a, in accordance with some embodiments. The dummy gate material layer 140a is made of polysilicon, in accordance with some embodiments. The dummy gate material layer 140a is deposited using a chemical vapor deposition process, in accordance with some embodiments.

As shown in FIG. 1A, a mask layer 150 is formed over the dummy gate material layer 140a, in accordance with some embodiments. The mask layer 150 exposes a portion of the dummy gate material layer 140a, in accordance with some embodiments. In some embodiments, the mask layer 150 includes oxide or nitride, such as silicon oxide, silicon oxynitride, silicon nitride, or the like. The mask layer 150 is formed by a depositing process (such as a chemical vapor deposition process), a photolithography process, and an etching process, in accordance with some embodiments.

As shown in FIG. 1B, the dummy gate material layer 140a exposed by the mask layer 150 is removed, and the gate dielectric material layer 130a under the removed dummy gate material layer 140a is also removed, in accordance with some embodiments. The dummy gate material layer 140a remaining under the mask layer 150 forms a dummy gate 140, in accordance with some embodiments. The gate dielectric material layer 130a remaining under the dummy gate 140 forms a gate dielectric layer 130, in accordance with some embodiments. The removal process includes a dry etching process, in accordance with some embodiments.

As shown in FIG. 1C, a first protective layer 160 is formed over the semiconductor substrate 110 to cover the mask layer 150, the dummy gate 140, and the gate dielectric layer 130, in accordance with some embodiments. The first protective layer 160 is configured to protect spacers formed subsequently from damage during a dummy-gate removal process, in accordance with some embodiments. The first protective layer 160 includes oxide, in accordance with some embodiments.

The first protective layer 160 is formed by an atomic layer deposition (ALD) process, a chemical vapor deposition process, or a physical vapor deposition (PVD) process, in accordance with some embodiments. The first protective layer 160 conformally covers the mask layer 150, the dummy gate 140, and the gate dielectric layer 130, in accordance with some embodiments.

As shown in FIG. 1D, a second protective layer 170 is formed over the first protective layer 160, in accordance with some embodiments. The second protective layer 170 is configured to protect the first protective layer 160, especially corner portions 162 of the first protective layer 160, from damage during subsequent processes (such as wafer cleaning processes or photoresist stripping processes).

Since the curvature of the corner portions 162 of the first protective layer 160 is greater than that of other portion of the first protective layer 160, the etching speed on the corner portions 162 is greater than the etching speed on the other portion of the first protective layer 160. Therefore, the corner portions 162 tends to be damaged during wafer cleaning processes or photoresist stripping processes, in accordance with some embodiments.

The first protective layer 160 and the second protective layer 170 include different materials, in accordance with some embodiments. The second protective layer 170 includes nitride or carbide, in accordance with some embodiments. The second protective layer 170 includes silicon nitride, silicon oxynitride, or silicon carbide, in accordance with some embodiments.

The second protective layer 170 is formed by an atomic layer deposition process, a chemical vapor deposition process, or a physical vapor deposition process, in accordance with some embodiments. The second protective layer 170 conformally covers the first protective layer 160, in accordance with some embodiments.

The second protective layer 170 is in direct contact with the first protective layer 160, in accordance with some embodiments. In some embodiments, a first thickness T1 of the first protective layer 160 is less than a second thickness T2 of the second protective layer 170.

In some embodiments, after the formation of the second protective layer 170, a wafer cleaning process is performed to remove contaminants and impurities over the semiconductor substrate 110 and/or the second protective layer 170. The wafer cleaning process uses a cleaning solution containing citric acid or other suitable solvents. The second protective layer 170 protects the first protective layer 160 from damage during the wafer cleaning process, in accordance with some embodiments.

As shown in FIG. 1E, a spacer layer 180a is formed over the second protective layer 170 to cover the mask layer 150, the dummy gate 140, and the gate dielectric layer 130, in accordance with some embodiments. The spacer layer 180a includes an insulating material, such as silicon oxide or silicon nitride. The spacer layer 180a is formed using a chemical vapor deposition process, in accordance with some embodiments.

As shown in FIGS. 1E and 1F, an anisotropic etching process is performed to remove a portion of the spacer layer 180a, in accordance with some embodiments. The spacer layer 180a remaining over the sidewalls of the mask layer 150, the dummy gate 140, and the gate dielectric layer 130 forms spacers 180, in accordance with some embodiments. The spacers 180 are configured to electrically isolate a gate formed subsequently from other devices and configured to act as a mask layer in a subsequent ion implantation process, in accordance with some embodiments. The anisotropic etching process includes a dry etching process, in accordance with some embodiments.

As shown in FIG. 1G, heavily doped regions 112 are formed in the semiconductor substrate 110, in accordance with some embodiments. The heavily doped regions 112 are formed using an ion implantation process, in accordance with some embodiments. The ion implantation process is performed to introduce p-type impurities (e.g., boron) or n-type impurities (e.g., phosphorus) into the semiconductor substrate 110, in accordance with some embodiments.

The heavily doped regions 112 are a heavily doped source region and a heavily doped drain region, in accordance with some embodiments. The heavily doped regions 112 are located at the two opposite sides of the dummy gate 140, in accordance with some embodiments.

As shown in FIG. 1G, stressors 190 are formed in the heavily doped regions 112 by using suitable processes, in accordance with some embodiments. The suitable processes include, for example, an etching process for removing a portion of the semiconductor substrate 110 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

As shown in FIG. 1H, a mask layer 210 is formed over the spacers 180 and the semiconductor substrate 110, in accordance with some embodiments. The mask layer 210 is a photoresist layer, in accordance with some embodiments. The mask layer 210 has an opening 212 exposing the second protective layer 170 over the mask layer 150, in accordance with some embodiments.

As shown in FIG. 1I, the mask layer 150, the second protective layer 170 and the first protective layer 160 over the mask layer 150 are removed through the opening 212, in accordance with some embodiments. The removal process includes a dry etching process, in accordance with some embodiments. Thereafter, the mask layer 210 is removed. The second protective layer 170 protects the first protective layer 160 from damage during the removal process of the mask layer 210, in accordance with some embodiments.

As shown in FIG. 1J, spacer oxide layers 220 may be formed over the spacers 180 and the stressors 190 by using, for example, a chemical vapor deposition process. The spacer oxide layers 220 may fill the gaps between the spacers 180 and the stressors 190 to facilitate films, which are subsequently formed, to cover the spacers 180 and the stressors 190 smoothly. However, in some other embodiments, the spacer oxide layers 220 are not formed.

As shown in FIG. 1J, a contact etch stop layer 230 is formed over the semiconductor substrate 110 to cover the stressors 190, in accordance with some embodiments. The contact etch stop layer 230 includes a dielectric material, in accordance with some embodiments. The contact etch stop layer 230 includes silicon nitride, in accordance with some embodiments.

The contact etch stop layer 230 is formed over the stressors 190, the spacers 180, the dummy gate 140, and the semiconductor substrate 110, in accordance with some embodiments. In some other embodiments, the contact etch stop layer 230 is not formed.

As shown in FIG. 1J, an insulating layer 240 is deposited over the contact etch stop layer 230, in accordance with some embodiments. The insulating layer 240 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The insulating layer 240 is deposited using a CVD process, a HDPCVD process, a spin-on process, a sputtering process, or a combination thereof, in accordance with some embodiments.

Afterwards, as shown in FIG. 1K, a planarization process is performed on the insulating layer 240 until a top surface of the dummy gate 140 is exposed, in accordance with some embodiments. The planarization process includes a chemical mechanical polishing (CMP) process, in accordance with some embodiments. After the planarization process is performed, the insulating layer 240 has a substantially planar surface to facilitate subsequent process steps. In some embodiments, a top surface 162 of the first protective layer 160 is aligned with a top surface 172 of the second protective layer 170.

As shown in FIG. 1L, the dummy gate 140 is removed, in accordance with some embodiments. The removal process for removing the dummy gate 140 includes a wet etching process, a dry etching process, or a combination thereof, in accordance with some embodiments. In some embodiments, the gate dielectric layer 130 is also removed. After the dummy gate 140 and the gate dielectric layer 130 are removed, an opening 182 is formed between the spacers 180. The opening 182 is a trench, in accordance with some embodiments.

The second protective layer 170 protects the first protective layer 160, especially the corner portion 162 of the first protective layer 160, from damage during the wafer cleaning process and the removal process for removing the mask layer 210 (as shown in FIG. 1H), in accordance with some embodiments. Therefore, the undamaged first protective layer 160 is able to protect the stressors 190 from damage during the removal process for removing the dummy gate 140 and the gate dielectric layer 130, in accordance with some embodiments.

As shown in FIG. 1M, a gate dielectric layer 250 is formed to cover a bottom of the opening 182, in accordance with some embodiments. The gate dielectric layer 250 further covers the inner walls of the opening 182, top surfaces of the first protective layer 160, the second protective layer 170, the spacers 180, the contact etch stop layer 230, and the insulating layer 240, in accordance with some embodiments.

The gate dielectric layer 250 includes a dielectric material, such as a high dielectric constant (high-k) material. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof, in accordance with some embodiments.

The gate dielectric layer 250 is deposited by any suitable process, such as atomic layer deposition (ALD), chemical vapor deposition (CVD), physical vapor deposition (PVD), sputtering, plating, other suitable processes, or combinations thereof, in accordance with some embodiments. In some embodiments, the gate dielectric layer 250 needs to be further annealed.

An intermediate dielectric layer (not shown) may be formed over the semiconductor substrate 110 before the gate dielectric layer 250 is formed. The intermediate dielectric layer includes a suitable dielectric material, such as silicon oxide, hafnium silicate, silicon oxynitride, or combinations thereof.

As shown in FIG. 1M, a work function metal layer 260 is deposited over the gate dielectric layer 250, in accordance with some embodiments. The work function metal layer 260 provides a desired work function for transistors to enhance device performance including improved threshold voltage.

In the embodiments of forming an NMOS transistor, the work function metal layer 260 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

On the other hand, in the embodiments of forming a PMOS transistor, the work function metal layer 260 can be a p-type metal capable of providing a work function value suitable for the device, such as equal to or greater than about 4.8 eV. The p-type metal includes metal, metal carbide, metal nitride, other suitable materials, or combinations thereof, in accordance with some embodiments. For example, the p-type metal is made of titanium, titanium nitride, other suitable materials, or combinations thereof.

The work function metal layer 260 is made of hafnium, zirconium, titanium, tantalum, aluminum, metal carbide hafnium carbide, or zirconium carbide), aluminide, ruthenium or combinations thereof, in accordance with some embodiments. The work function metal layer 260 is deposited using a PVD process, CVD process, ALD process, plating process, another suitable method, or combinations thereof, in accordance with some embodiments.

As shown in FIG. 1M, a gate electrode layer 270 (also called a metal gate electrode layer) is deposited over the work function metal layer 260 to fill the opening 182, in accordance with some embodiments. The gate electrode layer 270 includes a suitable metal material, such as aluminum, tungsten, gold, platinum, cobalt, another suitable metal, an alloy thereof, or combinations thereof, in accordance with some embodiments. The gate electrode layer 270 is deposited using a PVD process, a CVD process, a plating process, the like, or combinations thereof, in accordance with some embodiments.

Afterwards, as shown in FIG. 1N, a planarization process is performed to remove the gate electrode layer 270, the work function metal layer 260, and the gate dielectric layer 250 outside of the opening 182, in accordance with some embodiments. The planarization process includes a chemical mechanical polishing (CMP) process or the like, in accordance with some embodiments.

The gate electrode layer 270, the work function metal layer 260, and the gate dielectric layer 250 together form a gate stack G (i.e., a metal gate stack), which is surrounded by the insulating layer 240. The gate electrode layer 270 remaining in the opening 182 serves as a metal gate electrode of the gate stack G, in accordance with some embodiments.

As shown in FIG. 1O, an etching stop layer 280 (also called an insulating layer or a dielectric layer) is deposited over the top surfaces of the insulating layer 240, the contact etch stop layer 230, the spacers 180, the first protective layer 160, the second protective layer 170 the work function metal layer 260, and the gate electrode layer 270, in accordance with some embodiments. The etching stop layer 280 is made of silicon nitride, in accordance with some embodiments.

As shown in FIG. 1O, a protective layer 290 is formed on the etching stop layer 280, in accordance with some embodiments. The protective layer 290 is configured to protect the etching stop layer 280 from damage during a subsequent pre-amorphized implantation (PAI) process, in accordance with some embodiments. The protective layer 290 includes a plasma-enhanced oxide (PEOX) layer, in accordance with some embodiments.

As shown in FIG. 1P, portions of the protective layer 290, the etching stop layer 280, and the insulating layer 240 are removed to form contact openings 312 passing through the protective layer 290, the etching stop layer 280, and the insulating layer 240, in accordance with some embodiments. The openings 312 expose the stressors 190, in accordance with some embodiments. The removal process includes performing a photolithography process and an etching process, in accordance with some embodiments.

As shown in FIG. 1P, a dielectric spacer liner (DSL) layer 314 is conformally formed on the protective layer 290 and the sidewalls 312a of the contact openings 312, in accordance with some embodiments. The DSL layer 314 is configured to protect the sidewalls 312a from being damaged by the subsequent PAI process. The DSL layer 314 is made of, for example, SiOC or other suitable materials.

A pre-amorphized implantation (PAI) process is performed to reduce the dopant channeling effect and enhance dopant activation, in accordance with some embodiments. In some embodiments, silicon, germanium or carbon is used. In some other embodiments, inert gases, such as neon, argon, krypton, xenon, and/or radon, are used.

The PAI process prevents subsequently doped impurities from channeling through spaces within the crystal lattice structure and reaching depths greater than desired. Portions of the stressors 190 exposed and located at the bottoms 312b of the openings 312 are turned into an amorphous state as a result of the PAI process.

As shown in FIG. 1Q, a salicidation (self-aligned silicidation) process is performed to form metal silicide regions 192 on/in the stressors 190, in accordance with some embodiments. The material of the metal silicide regions 192 is made of nickel silicide, in accordance with some embodiments.

In some embodiments, the metal silicide regions 192 are made of a silicide material of a suitable metal material. The suitable metal material includes cobalt (Co), platinum (Pt), titanium (Ti), ytterbium (Yb), molybdenum (Mo), erbium (Er), or combinations thereof, in accordance with some embodiments. In some embodiments, the salicidation process is not performed.

As shown in FIG. 1Q, a conductive layer 320 is deposited on the protective layer 290 and is filled into the openings 312 to electrically contact the metal silicide regions 192, in accordance with some embodiments. The conductive layer 320 is formed by, for example, a PVD process or other suitable processes. The conductive layer 320 is made of, for example, tungsten or other suitable conductive materials.

As shown in FIG. 1R, a planarization process is performed to remove the conductive layer 320 and the DSL layer 314 outside the openings 312, and the protective layer 290, in accordance with some embodiments. The planarization process includes a chemical mechanical polishing (CMP) process, in accordance with some embodiments. After the CMP process, the conductive layer 320 remaining in the openings 312 forms contact plugs 322 electrically connecting the metal silicide regions 192 and the heavily doped regions 112 (i.e. the S/D regions).

After the CMP process, top surfaces of the contact plugs 322, the DSL layer 314, and the etching stop layer 280 are coplanar with each other, in accordance with some embodiments. As shown in FIG. 1R, a semiconductor device 300 is formed. The semiconductor device 300 is an n-type metal-oxide-semiconductor field-effect transistor (MOSFET) or a p-type MOSFET, in accordance with some embodiments.

In the semiconductor device 300, the first protective layer 160 conformally covers the sidewalls G1 of the gate stack G and a top surface 114 of the semiconductor substrate 110. The first thickness T1 of the first protective layer 160 ranges from about 5 Å to about 15 Å, in accordance with some embodiments. The second thickness T2 of the second protective layer 170 ranges from about 10 Å to about 35 Å, in accordance with some embodiments. In some embodiments, a sum of the first thickness T1 and the second thickness T2 ranges from about 15 Å to about 40 Å.

The first thickness T1, the second thickness T2, and the sum of the first thickness T1 and the second thickness T2 are maintained in a proper range, in accordance with some embodiments. If the first thickness T1 is too small, the first protective layer 160 may be unable to protect spacers during a dummy-gate removal process.

If the second thickness T2 is too small, the second protective layer 170 may be unable to protect the first protective layer 160 during wafer cleaning processes or photoresist stripping processes. If the sum of the first thickness T1 and the second thickness T2 is too large, the spacing between the spacer 180 of the semiconductor device 300 and the spacer of the neighboring semiconductor device (not shown) is too small to accommodate the contact plug 322.

In accordance with some embodiments, semiconductor device structures and methods for forming the same are provided. The methods (for forming the semiconductor device structure) form a second protective layer to protect a first protective layer from damage during wafer cleaning processes and a removal process for removing a mask layer. Therefore, the undamaged first protective layer is able to protect stressors from damage during a removal process for removing a dummy gate.

In accordance with some embodiments, a semiconductor device structure is provided. The semiconductor device structure includes a semiconductor substrate. The semiconductor device structure includes a gate stack positioned over the semiconductor substrate. The semiconductor device structure includes spacers positioned over sidewalls of the gate stack. The semiconductor device structure includes a first protective layer positioned between the gate stack and the spacers and between the spacers and the semiconductor substrate. The semiconductor device structure includes a second protective layer positioned between the spacers and the first protective layer. The first protective layer and the second protective layer include different materials.

In accordance with some embodiments, a semiconductor device structure is provided. The semiconductor device structure includes a semiconductor substrate. The semiconductor device structure includes a gate stack positioned over the semiconductor substrate. The semiconductor device structure includes spacers positioned over sidewalls of the gate stack. The semiconductor device structure includes a first protective layer positioned between the gate stack and the spacers and between the spacers and the semiconductor substrate. The semiconductor device structure includes a second protective layer positioned between the spacers and the first protective layer. A first thickness of the first protective layer is less than a second thickness of the second protective layer.

In accordance with some embodiments, a method for forming a semiconductor device structure is provided. The method includes forming a dummy gate over a semiconductor substrate. The method includes forming a first protective layer over the semiconductor substrate to cover the dummy gate. The method includes forming a second protective layer over the first protective layer. The first protective layer and the second protective layer include different materials. The method includes forming spacers over sidewalls of the dummy gate. The spacers are positioned over the second protective layer. The method includes forming a source region and a drain region in the semiconductor substrate. The source region and the drain region are positioned at two opposite sides of the dummy gate. The method includes removing the dummy gate, the first protective layer and the second protective layer over the dummy gate to form a recess between the spacers. The method includes forming a gate stack in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a gate stack positioned over the semiconductor substrate;
   spacers positioned over sidewalls of the gate stack;
   a first protective layer positioned between the gate stack and the spacers and between the spacers and the semiconductor substrate, wherein the first protective layer has a first portion located directly below the spacers;
   a second protective layer positioned between the spacers and the first protective layer, wherein the first protective layer and the second protective layer comprise different materials, wherein the second protective layer has a second portion entirely located directly above the first portion, wherein the second portion is thicker than the first portion, and wherein a first top surface of the first protective layer, a second top surface of the second protective layer, and a third top surface of the gate stack are coplanar; and
   a source region and a drain region positioned in the semiconductor substrate, wherein the second portion covers at least one of a part of the source region or a part of the drain region.

2. The semiconductor device structure as claimed in claim 1, wherein the first protective layer comprises oxide, the second protective layer comprises nitride or carbide, and the first protective layer is in direct contact with the second protective layer, the gate stack, and the semiconductor substrate.

3. The semiconductor device structure as claimed in claim 1, wherein the first protective layer conformally covers the sidewalls of the gate stack and a top surface of the semiconductor substrate, and the second protective layer conformally covers the first protective layer.

4. The semiconductor device structure as claimed in claim 1, further comprising:
   a stressor positioned in the source region or the drain region and passing through the first protective layer and the second protective layer.

5. The semiconductor device structure as claimed in claim 4, wherein the stressor is in direct contact with the first protective layer and the second protective layer.

6. The semiconductor device structure as claimed in claim 5, wherein the second portion covers the part of the source region, the stressor is positioned in the source region, and the part of the source region is between the first portion and the stressor.

7. The semiconductor device structure as claimed in claim 1, wherein an entire first top surface of the first protective layer, an entire second top surface of the second protective layer, an entire third top surface of the gate stack, and entire fourth top surfaces of the spacers are coplanar.

8. A semiconductor device structure, comprising:
   a semiconductor substrate;
   a gate stack positioned over the semiconductor substrate;
   spacers positioned over sidewalls of the gate stack;
   a first protective layer positioned between the gate stack and the spacers and between the spacers and the semiconductor substrate, wherein the first protective layer has a first portion located directly below the spacers;

a second protective layer positioned between the spacers and the first protective layer, wherein a first thickness of the first protective layer is less than a second thickness of the second protective layer, wherein the second protective layer has a second portion entirely located directly above the first portion, and wherein the second portion is thicker than the first portion;

a source region and a drain region positioned in the semiconductor substrate, wherein the second portion covers at least one of a part of the source region or a part of the drain region; and a stressor positioned in the source region or the drain region and passing through the first protective layer and the second protective layer, wherein the first portion is between the second portion and the stressor.

9. The semiconductor device structure as claimed in claim 8, wherein the second portion covers the part of the drain region, the stressor is positioned in the drain region, and the part of the drain region is between the first portion and the stressor.

10. The semiconductor device structure as claimed in claim 8, wherein the first protective layer comprises oxide, and the second protective layer comprises nitride or carbide.

11. The semiconductor device structure as claimed in claim 8, wherein the second protective layer has a bottom portion entirely directly below and in direct contact with the spacers, the first portion of the first protective layer is directly below the bottom portion of the second protective layer, and the first portion of the first protective layer is entirely separate from the spacers by the bottom portion of the second protective layer.

12. The semiconductor device structure as claimed in claim 8, wherein an entire first top surface of the first protective layer, an entire second top surface of the second protective layer, and entire third top surfaces of the spacers are coplanar.

13. The semiconductor device structure as claimed in claim 12, wherein the entire first top surface of the first protective layer, the entire second top surface of the second protective layer, the entire third top surfaces of the spacers, and an entire fourth top surface of the gate stack are coplanar.

14. A semiconductor device structure, comprising:
a semiconductor substrate;
a gate stack positioned over the semiconductor substrate;
spacers positioned over sidewalls of the gate stack;
a first protective layer positioned between the gate stack and the spacers and between the spacers and the semiconductor substrate, wherein the first protective layer has a first portion located directly below the spacers;

a second protective layer positioned between the spacers and the first protective layer, wherein the first protective layer is in direct contact with the gate stack and the second protective layer is in direct contact with the spacers, wherein the second protective layer has a second portion entirely located directly above the first portion, and wherein the second portion is thicker than the first portion;

a source region and a drain region positioned in the semiconductor substrate, wherein the second portion covers at least one of a part of the source region or a part of the drain region; and a stressor positioned in the source region or the drain region and passing through the first protective layer and the second protective layer, wherein the stressor is in direct contact with the first protective layer and the second protective layer.

15. The semiconductor device structure as claimed in claim 14, wherein the first protective layer and the second protective layer comprise different materials, the second protective layer has a bottom portion entirely directly below and in direct contact with the spacers, the first portion of the first protective layer is directly below the bottom portion of the second protective layer, and the first portion of the first protective layer is entirely separate from the spacers by the bottom portion of the second protective layer.

16. The semiconductor device structure as claimed in claim 14, wherein an entire first top surface of the first protective layer, an entire second top surface of the second protective layer, an entire third top surface of the gate stack, and entire fourth top surfaces of the spacers are coplanar.

17. The semiconductor device structure as claimed in claim 14, further comprising a spacer oxide layer positioned over the spacer and the stressor.

18. The semiconductor device structure as claimed in claim 14, wherein the first portion is between the stressor and the gate stack.

19. The semiconductor device structure as claimed in claim 18, wherein the second portion is between the stressor and the gate stack.

20. The semiconductor device structure as claimed in claim 14, wherein a portion of the spacers is between the stressor and the second protective layer.

* * * * *